US006882965B1

(12) United States Patent
Hoover (10) Patent No.: US 6,882,965 B1
(45) Date of Patent: Apr. 19, 2005

(54) METHOD FOR HIERARCHICAL SPECIFICATION OF SCHEDULING IN SYSTEM-LEVEL SIMULATIONS

(75) Inventor: Christopher Hoover, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 729 days.

(21) Appl. No.: 09/691,406

(22) Filed: Oct. 17, 2000

(51) Int. Cl.$^7$ ............................................. G06F 17/50

(52) U.S. Cl. .................................. 703/14; 716/2; 716/5

(58) Field of Search ......................... 703/14, 2; 716/5, 716/2

(56) References Cited

U.S. PATENT DOCUMENTS 5,963,447 A    10/1999    Kohn et al.

OTHER PUBLICATIONS

Pees et al. (On core or more: A Design Perspective for System—on–a–Chip, 1997).*
Marelli (Cadence virtual component co–design (VCC) environment for engine control unit design).*
Evans (Embedded software Systems—Codesign Projects, Feb. 21, 1998).*
Lavagno et al. (HW/SW Co–Design for Embedded Systems, 1998).*
Balarin et al. (POLIS A design environment for control–dominated embedded systems ver. 0.4 User's Manual, Nov. 10, 1999).*
Giusto et al. (HW/SW Co–Design for Embedded Systems, 1996).*
Rogers, P. et al. (1997) "A Simulation Testbed for Comparing the Performance of Alternative Control Architectures," *Proceedings of the 1997 Winter Simulatin Conference*, pp. 880–887.
Oreizy, P. et al. (1999) "An Architecture–Based Approach to Self–Adaptive Software," *IEEE Intelligent Systems*, 14(3):54–62.
Clarke, P. (1999) "Cadence Virtual Component Codesign Tools Set for Jan. Release," *Electronic Engineering Times*, 1087:80.
Santarini, M. (2000) "Cadence Rolls System–Level Design to Fore," *Electronic Engineering Times*, 1095:pp. 1, 22, 24 and 130.

(Continued)

Primary Examiner—Thai Phan
Assistant Examiner—Sunray Chang
(74) Attorney, Agent, or Firm—Reed Smith LLP; John W. Carpenter (57) ABSTRACT

A method for hierarchical specification and modeling of scheduling in system-level simulations. The invention addresses the specification aspect by introducing an explicit notion of a scheduler that must be designed as part of the system. A scheduler effectively represents a scheduling policy for an architectural resource. A scheduling policy governs how behaviors assigned to a resource, gain access and share the resource. The invention includes a general framework for modeling a scheduling policy, which includes a simple mechanism that covers many common cases. This framework is part of a Virtual Component Codesign (VCC) process, which is targeted at consumer embedded system design. Two orthogonal models, one of a scheduler and one of a schedulable, comprise the overall modeling of scheduling in the invention. The two models interact by sending messages to each other via a simple protocol. The protocol itself is implemented by a pair of abstract interfaces, which in turn are implemented in concrete schedulable and scheduler objects in the simulator.

42 Claims, 5 Drawing Sheets

OTHER PUBLICATIONS

Cassagnol, Bob; et al., "Codesigning a Complex System on a Chip with Behavioral Modesl," Nov. 1998, http://2www.isdmag.com/Editorial/1998/coverstory9811.html, Mar. 18, 2000.

Cadence website, Cadence Press Release, "Addressing the Systems–in–Silicon Verification Challenge," http://www.cadence.com/press_box/na/pr/1995/inca.html, Mar. 18, 2000.

Cadence website, "System–Level design," http://www.cadence.com/technology/hwsw/vcc/html, Mar. 18, 2000.

Cadence website, "System–Level design," http://www.cadence.com/technology/hwsw/, Mar. 18, 2000.

Cadence website, "Digital Block Implementation," http://www.cadence.com/technology/digital/, Mar. 18, 2000.

Cadence website, "Functional Design and Verification," http://www.cadence.com/technology/funct/, Mar. 18, 2000.

Cadence website, "Custom Block Implementation," http://www.cadence.com/technology/custom/, Mar. 18, 2000.

Cadence webstie, "Physical Verification, Extraction and Analysis," http://www.cadence.com/technology/phys/, Mar. 18, 2000.

Cadence website, "Chip Planning and Assembly," http://www.cadence.com/technology/chip/, Mar. 18, 2000.

Cadence webstie, "PCB Design and IC Packaging," http://www.cadence.com/technology/pcb, Mar. 18, 2000.

Wilson, Les and Critten, Jeff, "White Paper: DSP SOC Design Methodology for Digital Camera," 2000, Cadence Design Systems, Inc.

* cited by examiner

```
class FxSchedulerInterface
{
public:
        //
        // Messages sent from FxSchedulableInterface objects.
        virtual void schedulerActivationNotice(
                FxSchedulableInterface *) = 0;
        virtual void schedulerFinishNotice(
                FxSchedulableInterface *) = 0;
};
```

FIG. 5

```
class FxSchedulableInterface
{
public:
        //
        // Messages sent to FxSchedulerInterface objects.
        virtual void schedulableStart() = 0;
        virtual void schedulableSuspend() = 0;
        virtual void schedulableResume() = 0;
        virtual void schedulableAbort() = 0;
};
```

```
task_ABD() (
        while (1) (          // cyclo-static schedule in task
                read_events();
                A_Run();          // 1
                B_Run();          // 2
                D_Run();          // 3
                post_events();
        )
)

irq_handler_C() (
        C_Run();             // interrupt handler
        post_events();
)

task_E() (
        while (1) (          // single behavior in task
                read_events();
                E_Run();
                post_events();
        )
)

main() (                     // initialization
        rtos_create_task(task_ABD, ...)
        rtos_install_handler(irq_handler_C, ...)
        rtos_create_task(task_E, ...);
        ...
)
```

FIG. 8

METHOD FOR HIERARCHICAL SPECIFICATION OF SCHEDULING IN SYSTEM-LEVEL SIMULATIONS

BACKGROUND OF THE INVENTION

1. Field of the Invention

The present invention relates to hierarchical specification and modeling of scheduling in system-level simulations of consumer embedded systems.

2. Background

The design of consumer embedded systems today is changing dramatically as product time-to-market and life cycles shrink, and product requirements grow with the continuing merger of communication and computing. Software, once a minor aspect of a design, is beginning to dominate. The re-use of intellectual property has become mandatory, as no single company possesses all the expertise required to build tomorrow's converging products.

The Virtual Component Codesign (VCC) methodology, available from Cadence Design Systems, assignee of the present invention, is designed to address these concerns at the system level. VCC is a methodology that is paired with a set of tools and libraries for the evaluation, selection, integration, and specification of virtual components (intellectual property) for embedded systems design. Virtual components in this context include not only hardware and software behaviors, but hardware and software architectures as well.

Three major tasks comprise the design flow in VCC: Composing behavior, capturing architecture and mapping behavior onto architecture. Behavior in VCC is expressed as a discrete event network of blocks that pass high-level tokens. Architecture in VCC is expressed as a topology of hardware and software structures. Mapping in VCC is an assignment of behavior onto architectural structures.

The assignments in the mapping determine which behavioral blocks become hardware and which become software, and how communication between behaviors occurs. The assignment of multiple behavioral blocks to a single architectural resource is allowed and denotes sharing. For example, a single microcontroller, shared by all software behaviors, is quite common in most consumer embedded systems.

The VCC environment provides a comprehensive system-level design environment that allows the user to clearly differentiate between a behavior model, which identifies what the system does, and an architecture model, which identifies how the system is implemented. This clear differentiation between system function and architecture allows system designers to simulate the performance effects of a behavior running on a number of different architectures early in the design cycle.

The VCC environment is an environment in which the system designer works with graphical representations of virtual components, both functional and architectural. The VCC behavior diagram editor permits capturing the function of a system by creating a behavior diagram—a collection of functional models that are wired together.

In top-down design flow using the VCC environment, designers create behavioral models by a) placing an undefined block, b) specifying the interface and the design parameters, and c) generating a symbol for this block. Once the user specifies how this block is to be implemented, a window with a default template for the model's behavior is generated. In bottom-up design flows using the VCC environment, designers use the hierarchical behavior diagram editor to instantiate graphical symbols representing already existing behavioral models, and then create the interconnections between these symbols.

VCC provides the ability to import functional IP from a wide variety of sources into the VCC simulation environment and allows designers to simulate the complete functionality of heterogeneous systems. This simulation then can be used as an executable functional specification.

Using a VCC architecture diagram editor, designers capture the abstract target architecture onto which the system function will be mapped. Since it is a complete Co-design environment, the VCC environment supports essential architectural elements such as CPUs, DSPs, RTOSs, buses, memories, and dedicated hardware and software. To allow fast design evaluation, these architectural elements are modeled at a higher level of abstraction than implementation-level C or HDL.

A VCC mapping diagram editor enables designers to map system functionality onto target architectural platforms. This mapping defines candidate hardware and software partitions and helps to identify the custom hardware needed to complete the system design. Designers also use the mapping diagram editor to refine communication wires.

Once a mapping diagram is completed, the system designers can evaluate the mapped design using performance simulation, which is enabled by software estimation and performance parameters that are annotated within timing free functional models.

In VCC, performance simulation determines, for a particular mapped design, whether the timing of the system meets the user's requirements. If not, the user can map portions of the behavioral blocks to different architectural blocks, possibly causing their implementation to move between hardware and software. The design may be a system-on-a-chip with embedded processors, memories, and custom hardware, or it may be composed of discrete processors, memories and multi-function component chips.

When the design is at the fully refined level within VCC and its performance meets the system requirements, the user can export it as a software and hardware implementation. The hardware design will then be ready for HDL simulation, floor planning and logic synthesis. The software models will then be ready for linking to an RTOS (real-time operating system).

Software export of the user's application comprises configuring the selected RTOS for the chosen processor. This includes creating tasks, adding appropriate mechanisms for inter-task and intra-task communication, synthesizing static schedulers where multiple behaviors are mapped to the same task, configuring the RTOS scheduler, setting up interrupt handlers, and setting-up counters and timers.

To avoid situations where too many tasks are running on an RTOS (potentially resulting in unacceptably high-context switching overhead), the VCC environment allows the user to map multiple behavioral blocks to the same task. In this situation, VCC synthesizes a static scheduler, i.e., a simple sequential execution of the behaviors' run functions.

VCC also employs simulation to allow a designer to evaluate a mapping. Using simulation to evaluate a mapping requires the specification and modeling of the scheduling of shared architectural resources. Specifying proper scheduling for a design is critical because the scheduling materially affects the feasibility, quality, reliability, and cost of a design.

The present invention therefore resolves the issues of how to specify scheduling at the system level, and how to use such a specification in simulation and software implementation.

SUMMARY OF THE INVENTION

The present invention provides a framework for the specification of of scheduling that is:

Useful for both simulation and implementation;

Abstract and thus lends itself to system-level simulation and making model writing straightforward;

Flexible in order to allow a designer to specify and investigate a wide variety of scheduling policies and related issues such as system modes;

Hierarchical so that complex scheduling policies may be composed from simple ones;

Orthogonal to the technique used to model the performance of behavior;

The invention addresses the specification aspect of the problem directly by introducing an explicit notion of a scheduler that must be designed as part of the system. A scheduler effectively represents a scheduling policy for an architectural resource. A scheduling policy governs how behaviors assigned to a resource, gain access and share the resource. The invention includes a general framework for modeling a scheduling policy, which includes a simple mechanism that covers many common cases. The invention allows for composition of scheduling policies via hierarchy; a scheduler may be assigned to another scheduler.

The related simulation aspect of the problem is this: Once a behavioral block in a system is mapped onto an architectural resource in VCC, the block represents an abstract process that must contend for an architectural resource in order to react to incoming events. Furthermore, a mapped block requires a finite amount of time to perform a reaction.

It is desired to use a discrete event simulator in VCC, as the discrete event model closest to the desired behavior model of computation. In a traditional discrete event simulator, blocks communicate by scheduling events which are tagged with a timestamp. The simulator maintains a list of all events in the system sorted by these timestamps, and repeatedly processes the event with the smallest timestamp (i.e., in chronological order). When an event is processed for a block, the block reacts or "fires," possibly scheduling new events. All blocks scheduled at a given instant of time execute concurrently in zero "time" as if on an infinitely fast, infinitely parallel machine. For many problem domains, such as communication network and digital circuit design, this abstraction is usually appropriate. However, for VCC this model is not appropriate for the simulation of a mapped design, because reactions take finite time and contend for finite computing resources. Thus, the invention herein changes the traditional discrete event model to include:

An explicit model of activation which occurs as a result of the traditional discrete event scheduling;

An explicit model of contention that reflects the scheduling of the architectural resource; and An explicit model of reaction of a behavior that allows the reaction to take time.

The related implementation problem addressed herein is how to use the specification to synthesize the structure of an implementation. The invention herein can generate from the specification, working software code (C, C++, assembly language) for a consumer device that implements specified scheduling policies. Furthermore, it can be configured and interfaced to existing software such as a commercially available real-time operating system to implement such scheduling policies.

BRIEF DESCRIPTION OF THE DRAWINGS

The aforementioned features of the present invention, as well as additional features thereof, will be more fully understood hereinafter as a result of a detailed description of a preferred embodiment when taken in conjunction with the following drawings in which.

DETAILED DESCRIPTION OF A PREFERRED EMBODIMENT

Two orthogonal models, one of a scheduler and one of a "schedulable," comprise the overall modeling of scheduling in the invention. The two models interact by sending messages to each other via a simple protocol. The protocol itself is implemented by a pair of abstract interfaces, which in turn are implemented in concrete schedulable and scheduler objects in the simulator.

Figure 1:
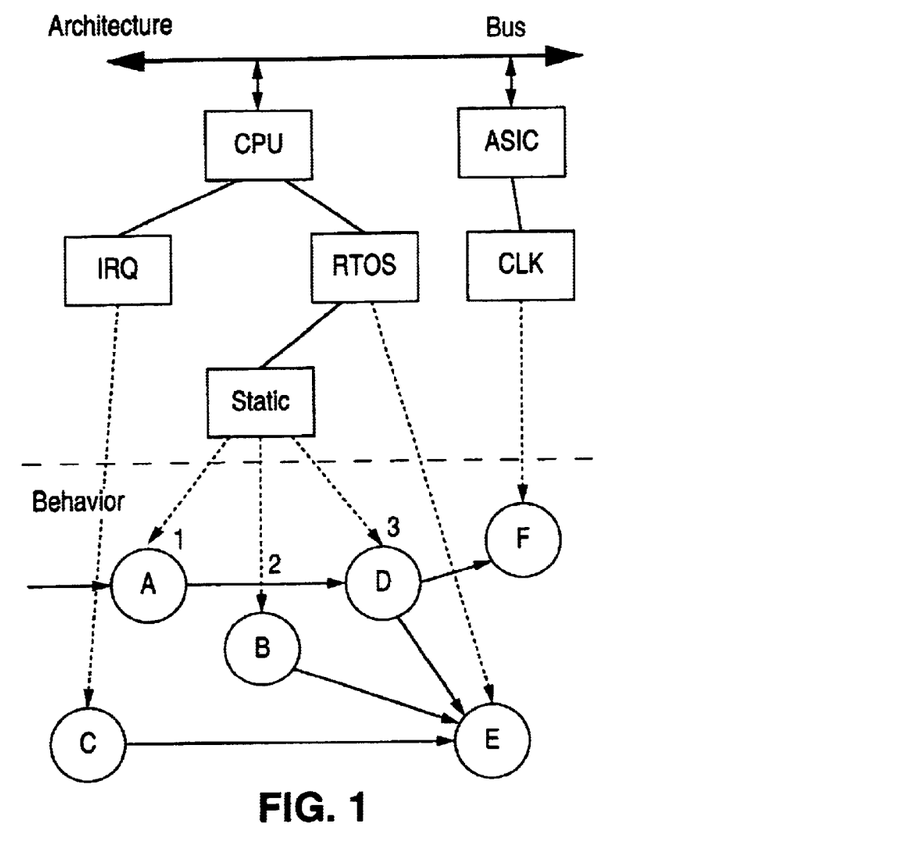
FIG. 1 is a block diagram illustration of a specification of Behavior, Architecture and Mapping tasks which comprise design flow in VCC.

FIG. 1 illustrates the design flow in VCC which consists of a) composing behavior; b) capturing architecture; and c) mapping behavior onto architecture. The area above the dotted line in FIG. 1 provides the scheduler components of which the CPU, ASIC and clock (CLK) are physical entities and of which the remaining IRQ (interrupt request), RTOS real timing operating system) and a static scheduler are software entities. The static scheduler is synthesized by VCC and comprises a simple sequential execution of the behaviors' run functions. The behaviors, which are below the dotted line of FIG. 1, are represented as oval blocks designated by letters A through F. Behaviors A, B and D are schedulables scheduled by the static scheduler in the inherent order shown by reference numbers 1, 2 and 3. Schedulable C is scheduled by the IRQ; schedulable E is scheduled by the RTOS after receiving input from A, B, C and D; and schedulable F is scheduled by the clock after receiving input from A and D.

A schedulable represents the unit of scheduling for a given scheduler. A schedulable is required to have separate notions of:

Activation, i.e., wanting to be scheduled; and

Figure 2A:
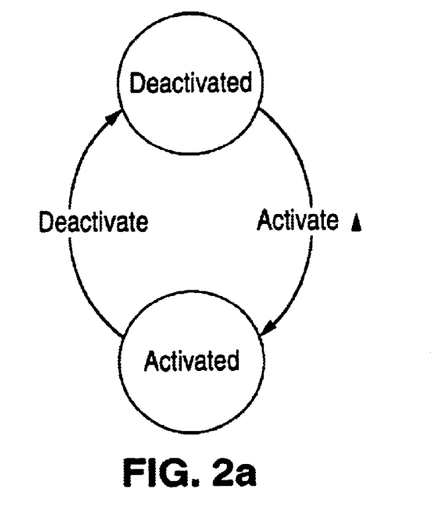
FIG. 2 is a state diagram of a simple "schedulable" in accordance with an embodiment of the invention.
Figure 2B:
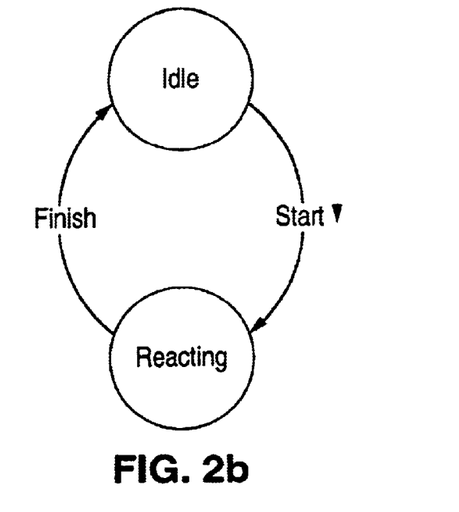

Reaction, i.e., starting upon being scheduled and (usually) finishing. This model may be represented as a pair of concurrent finite state machines, as shown in FIG. 2.

A schedulable itself has no interesting behavior, but rather represents a behavior in the framework. A schedulable, and hence a behavior, is always assigned to a single scheduler.

The specific semantics of activation are not part of the framework or the schedulable object; rather, they arise from the underlying behavior. For discrete event behaviors, the notion of activation is equivalent to receiving an event from the simulator. This, however, is far from universal. A behavior with dataflow semantics might only be activated after receiving "enough" events from the simulator. Likewise, the specific semantics of a reaction are not part of the schedulable or the framework. The framework simply requires the schedulable to allow the framework to control when a behavior begins its reaction ("fires" in discrete event terminology), and to inform the framework when a reaction ends. How long a reaction takes is defined by the behavioral model itself or other mechanisms. A schedulable in the present framework is most often a behavior representing a software process or task. However, the model is general enough that a schedulable can be other things, e.g., a hardware process gated by a clock.

Figure 3A:
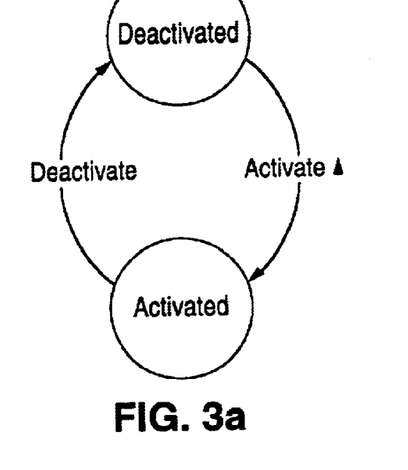
FIG. 3 is a state diagram of an extended "schedulable"
Figure 3B:
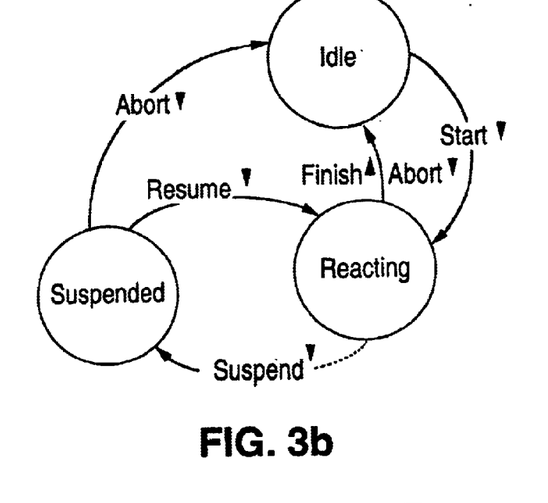

FIG. 3 shows this model as it has been extended to support preemption, which is required to model software scheduling. Support for preemption in the invention requires that a schedulable allow the framework to suspend, resume, and abort a behavior's reaction. For some behaviors these concepts are not well defined and therefore not all schedulables need implement suspend, resume, and abort.

As discussed earlier, the invention separates the mechanisms of activation and reaction. A scheduler represents the relation between these mechanisms for the schedulables assigned to it. This relation is the scheduling policy imposed on the schedulables. The general framework places few restrictions on this relationship beyond the usual simulation causality restrictions.

To illustrate we draw two extremes. A scheduler modeling a clock for digital hardware could choose to completely disregard the notion of activation in favor of simply starting the reactions of all of its assigned schedulables at a fixed frequency. In contrast, a scheduler modeling a real-time operating system (RTOS) would track activations of the schedulable (tasks) as the activations abstractly represent requests for service. In such a scheduler, the relation between activation and reaction is typically a complex function involving those schedulables which are activated and a set of priorities associated with the schedulables.

If the schedulables assigned to a scheduler support preemption, then the scheduler also represents the relation of activation to preemption. Most scheduling policies can be implemented in this framework, including typical software scheduling policies such as cyclo-static, static priority, dynamic priority, and round robin. Note that even the traditional discrete event model can be modeled with a trivial scheduler that forces its assigned schedulables to react immediately whenever they become activated. Any object can implement the schedulable interface, subject to the restrictions above. The composition of schedulers via hierarchy is facilitated by building a scheduler that also implements the schedulable interface. Any such scheduler can be assigned to a parent scheduler.

A schedulable scheduler must define what activation and reaction means. In the useful cases we have analyzed the activation of a scheduler as a function of the activation of its assigned schedulables. Activation can thus be viewed as propagating up the hierarchy, and this is exactly what happens in the protocol. Reaction is similar except that it flows down the hierarchy.

A protocol has been designed and implemented that allows a modeler to build a broad range of models of scheduling policies without becoming involved in the details of the underlying simulator. The invention arranges for a scheduler to find its assigned schedulables and arranges for the schedulables to find their assigned scheduler. This is the initialization phase of the protocol.

Figure 4:
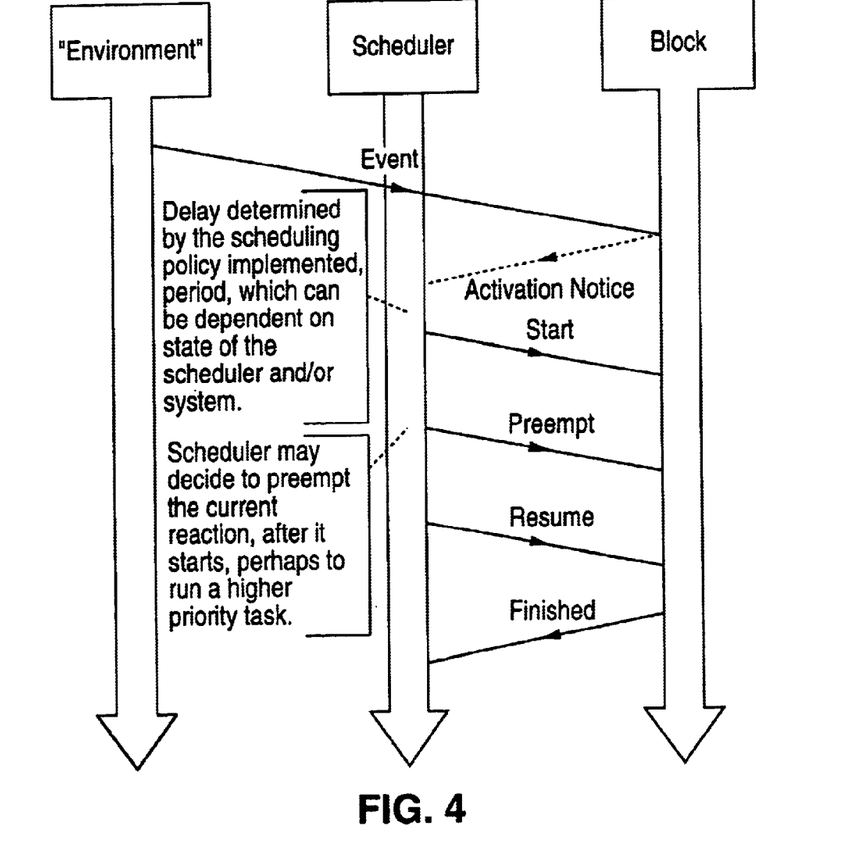
FIG. 4 is a conceptual illustration of an informal MSC for a protocol showing a typical interaction.

An example of a typical interaction in the protocol is shown in FIG. 4. In this scenario, an event is sent to a schedulable by the simulator. It does not cause the schedulable's underlying behavior to react; rather the schedulable's underlying behavior determines that it wishes to react, which, in turn, causes the schedulable to send an activation notice to its assigned scheduler. Some time later the scheduler sends a message to the schedulable instructing it to start its behavior's reaction and upon receipt it does so. Later, before the reaction can finish, the scheduler determines that it must preempt the running reaction and it sends the schedulable a suspend message. The receipt of this message causes the schedulable to temporarily halt the execution of its underlying behavior. Eventually, the scheduler re-schedules the block and restarts the suspended reaction by sending a resume message, which causes the schedulable to resume execution of the behavior. Finally, the reaction finishes, at which point the schedulable sends a finish notice back to its assigned scheduler.

TABLE 1

| Sender | Message | Meaning |
|---|---|---|
| Scheduler | Start | Start reaction |
| Scheduler | Suspended | Suspend reaction |
| Scheduler | Resume | Resume suspended reaction |
| Scheduler | Abort | Abort running or suspended reaction |
| Scheduler | Activation | Behavior wants to be scheduled |
| Scheduler | Finish | Running reaction finished |

Table 1 shows the messages involved in the protocol. The messages from schedulables effectively contain the identity of the sender so that a scheduler can tell which schedulable became activated or finished.

Figure 5:
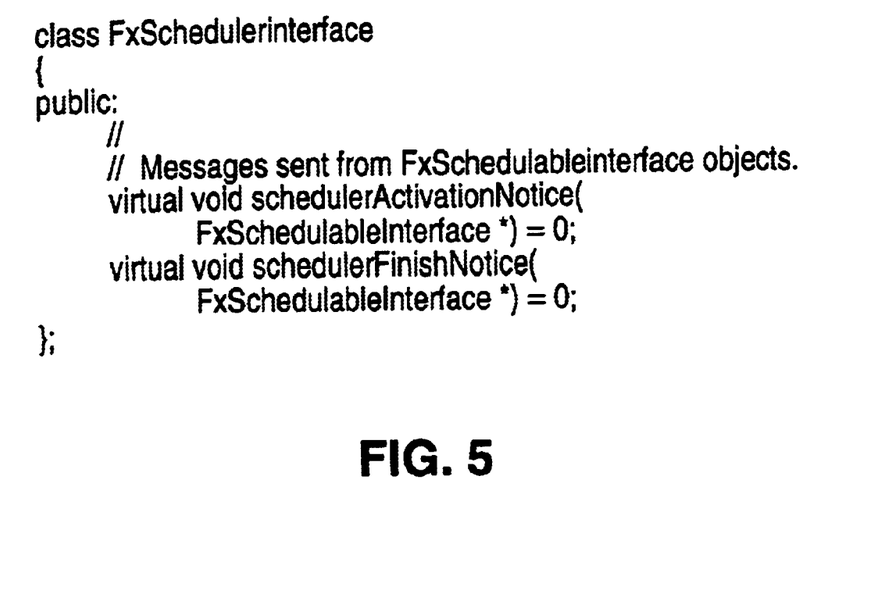
FIGS. 5 and 6 illustrate a pair of C++ classes for essential scheduler and schedulable interfaces.
Figure 6:
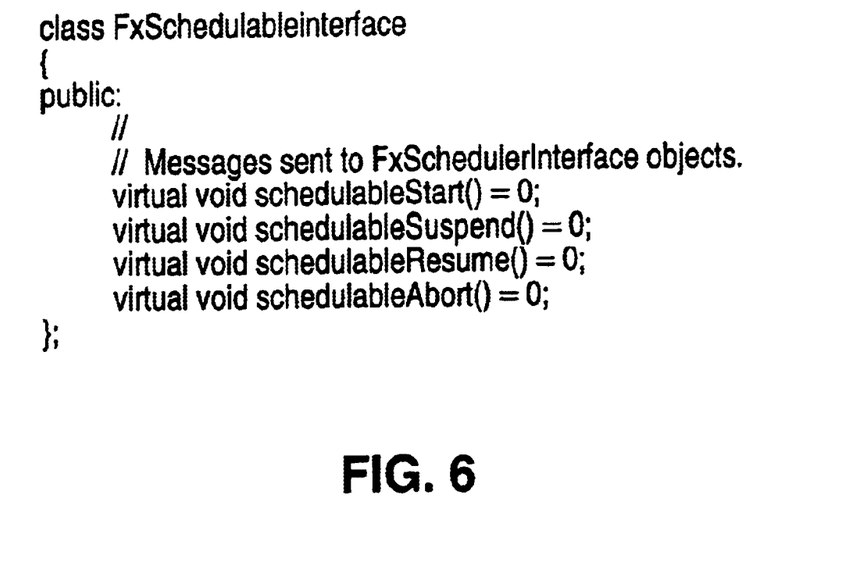

A pair of C++ classes, shown in FIGS. 5 and 6, implement this protocol by defining abstract interfaces for schedulable and scheduler objects. The FxSchedulableInterface class is rarely implemented directly. This is usually handled by a class called a delay meta-model that is simply used by the designer for a particular modeling style. The FxSchedulerInterface class is used either directly or indirectly by a modeler to build a model of a particular scheduling policy.

The framework has a "basic" scheduler class, called FxBasicScheduler, that includes behavior and bookkeeping typically needed to build a scheduling model. The modeler often can subclass and refine this class to build a particular model, in which case the job of model building is fairly simple. The option to implement the entire FxSchedulerInterface class, however, is always available should the basic class prove insufficient, but at the cost of increased responsibility and complexity.

The applicability of FxBasicScheduler in a given situation is largely governed by a concurrence assumption built into the class. This assumption is that only one of its assigned schedulables is in the reacting state at any given time. Clearly FxBasicScheduler would not be an appropriate basis for the hardware clock scheduler example illustrated earlier; however it is appropriate for most models of software scheduling.

Figure 7:
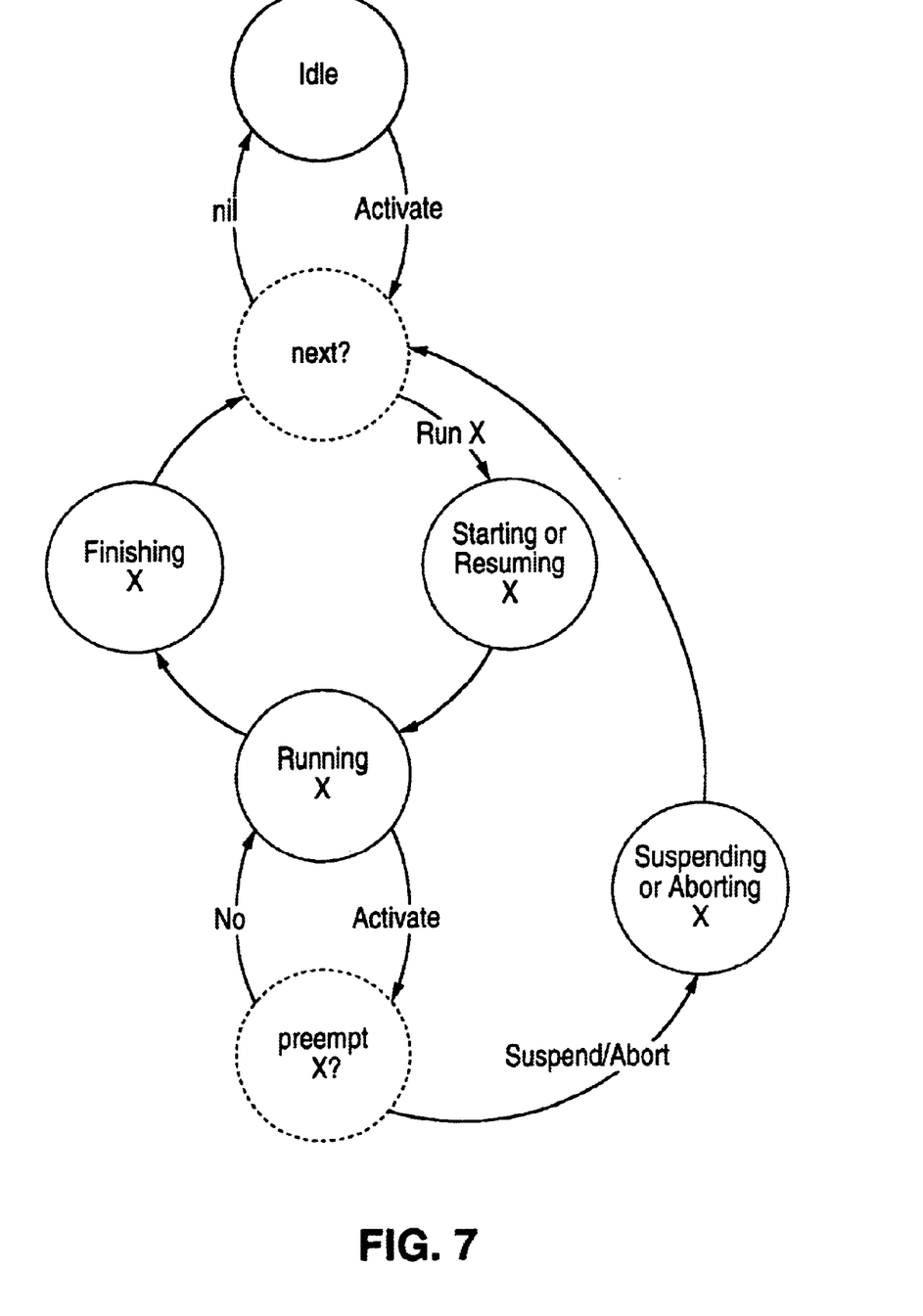
FIG. 7 is a state diagram of a basic scheduler class called FxBasicScheduler illustrating two abstract functions; i.e., "next?" and "preempt?"

The model used within FxBasicScheduler is shown in FIG. 7. The user is required to supply an implementation for two relatively simple abstract (pure virtual) functions in order to refine the model. The first such abstract function is the "next?" function. It is called whenever the model passes through the "next" state. This occurs either when the scheduler receives an activation notice while idle or whenever a reaction ends, whether naturally or via preemption. The function is expected to return a handle to the schedulable which should be run next or nil if there is not one. The second such abstract function is the "preempt?" function. It is called whenever an activation occurs while a schedulable is reacting. It is expected to make a determination whether preemption should happen, and if so, which method should be used, suspend or abort.

Modeling the performance of scheduling with FxBasic-Scheduler is facilitated by allowing the modeler to specify how long it takes to transition through the starting/resuming, finishing, and suspending/aborting states. A trivial mechanism exists to assign constant times to these operations, and an alternative mechanism exists to supply a set of functions, which can be dependent on state of the scheduler or system if need be.

The specification in this framework can be used to automatically generate some of the software required for an implementation.

Figure 8:
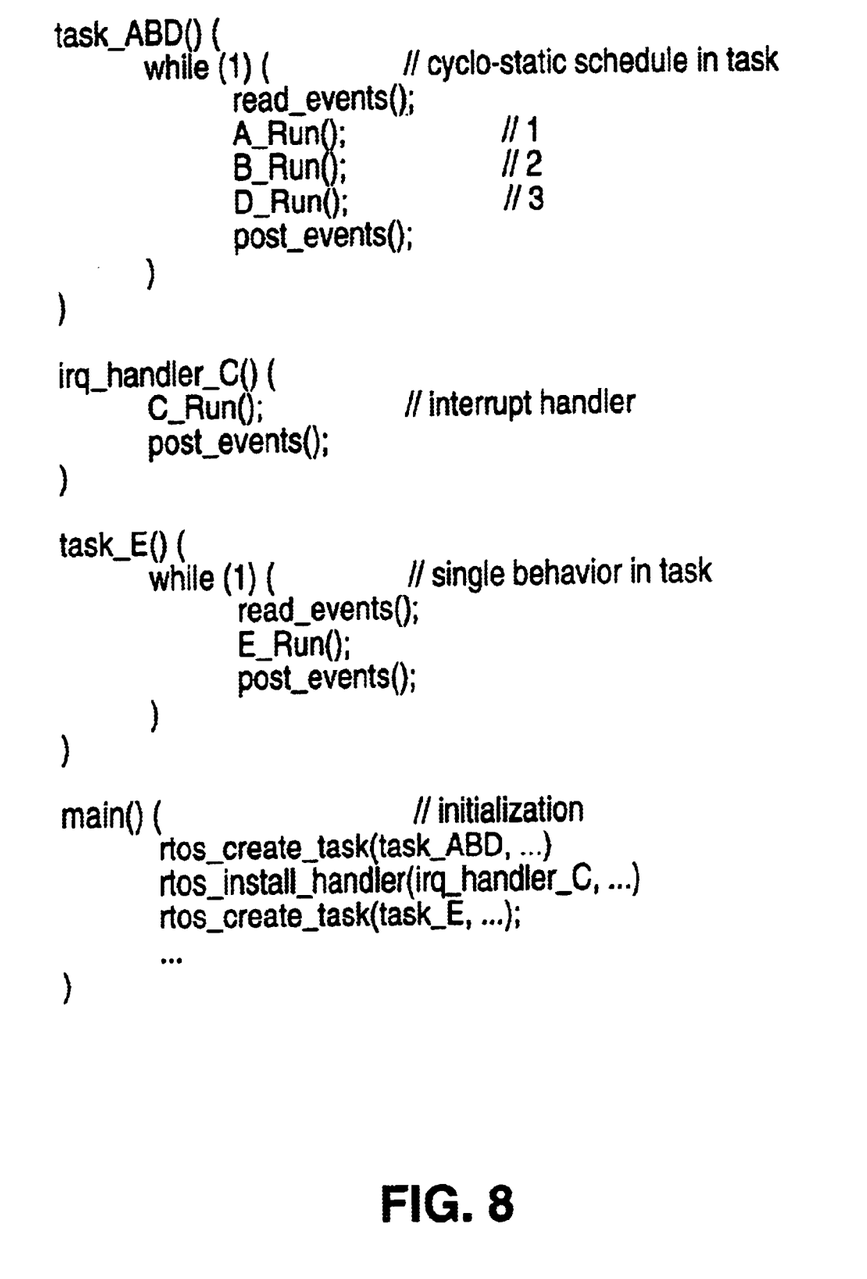
FIG. 8 is a pseudo-code example for the specification of FIG. 1.

In FIG. 1, we have three behaviors (A, B, and D) assigned to a static scheduler. This is interpreted as a directive to synthesize a cyclo-static scheduler containing the associated behaviors for the implementation. The priorities on the mapping assignments yield the order of the schedule. This static scheduler and a behavior (E) are assigned to the RTOS, which indicates that the behavior, as well as the cyclo-static scheduler, should become tasks created by the RTOS. Thus, we synthesize two such tasks. In addition to the RTOS, an interrupt request (IRQ) is assigned to the processor. This directs us to synthesize and assign an interrupt handler containing behavior C for the IRQ. Pseudo-code for the resulting implementation is shown in FIG. 8.

Schedulers in accordance with the invention have been constructed for the following policies thus far: cyclo-static, non-preemptive static priority, and preemptive static priority. To illustrate the ease of expressing a software scheduling policy using the framework, consider the preemptive static priority scheduler which only required a dozen lines of real code and on the order of hundred total lines when counting the C++ kernal. Several working software synthesis prototypes have also been constructed, including one that generates a small range of cyclo-static schedules and one that can target an RTOS.

Having thus disclosed an illustrative embodiment of the invention, it being understood that other embodiments are contemplated and that the scope of the invention is to be limited only by the appended claims and their equivalents, What is claimed is:

1. In a system-level design and integration system which facilitates composing behavior, capturing architecture and mapping behavior onto architecture, a method for specification of scheduling for simulation and implementation of consumer embedded systems; the method comprising the steps of:

a) identifying the schedulers in an architecture;
b) identifying the schedulables constituting behavior;
c) assigning schedulables and schedulers to each other;
d) arranging for the schedulers to find their respective assigned schedulables;
e) arranging for the schedulables to find their respective assigned scheduler;
f) sending an event to a schedulable;
g) sending an activation notice from the schedulable in step f) to its assigned scheduler;
h) sending a message from the assigned scheduler of step g) to the schedulable of step f) to start its behavior's reaction; and
i) sending a finish notice from the schedulable of step f) to the scheduler of step g) when said reaction is completed.

2. The method recited in claim 1 further comprising the steps of:

h1) having the scheduler of step g) determine whether the reaction of the schedulable of step f) must be preempted before it is finished;
h2) if in step h1) preemption is required, sending a suspend message from the scheduler of step g) to the schedulable of step f) to temporarily halt the execution of its reaction;
h3) if in step h1) preemption is required, causing the schedulable of step f) to halt its reaction in response to the suspend message;
h4) if in step H1) preemption is required, eventually sending a resume message from the scheduler of step g) to the schedulable of step f).

3. The method recited in claim 2 further comprising the steps of:

providing a next function which occurs when a scheduler receives an activation notice from an assigned schedulable while said scheduler is idle and when an assigned schedulable has finished a reaction;
said next function sending a handle to a schedulable which will be starting its behavior's reaction next.

4. The method recited in claim 2 further comprising the steps of:

providing a "preempt" function which occurs when an activation notice is received by a scheduler while its assigned schedulable is already reacting;
said "preempt" function determining whether a preemption should occur and whether such a preemption should be accomplished by suspending or aborting the reaction to be preempted.

5. The method recited in claim 2 further comprising the steps of:

providing a "next" function which occurs when a scheduler receives an activation notice from an assigned schedulable while said scheduler is idle and when an assigned schedulable has finished a reaction;
said next function sending a handle to a schedulable which will be starting its behavior's reaction next;
providing a preempt function which occurs when an activation notice is received by a scheduler while its assigned schedulable is already reacting;
said preempt function determining whether a preemption should occur and whether such a preemption should be accomplished by suspending or aborting the reaction to be preempted.

6. The method recited in claim 5 further comprising the steps of:

assigning transition times for completing selected states in said scheduler and schedulable operations including the steps of starting and resuming reactions, finishing reactions, and suspending and aborting reactions.

7. The method recited in claim 6, wherein the assigned transition times are assigned based on a set of functions dependent upon a state of the scheduler.

8. The method recited in claim 2 wherein steps h1) to h4) are carried out in accordance with a cyclo-static scheduling policy.

9. The method recited in claim 2 wherein steps h1) to h4) are carried out in accordance with a non-preemptive static priority scheduling policy.

10. The method recited in claim 2 wherein steps h1) to h4) are carried out in accordance with a preemptive static priority scheduling policy.

11. The method recited in claim 2 wherein steps h1) to h4) are carried out in accordance with a selected scheduling policy.

12. The method recited in claim 11 further comprising the step of altering said selected scheduling policy based upon behavior of said embedded systems.

13. The method recited in claim 11 further comprising the step of generating software code for a consumer device to implement said selected scheduling policy.

14. The method recited in claim 11 further comprising the step of implementing said scheduling policy by interfacing to existing commercially available software.

15. The method recited in claim 1 further comprising the step of:

scheduling behaviors of said schedulables based in part on the priorities of mapping assignments of said schedulables.

16. A method for generating scheduling implementation for an embedded system expressed as an architecture, a behavior and a mapping of the behavior into the architecture; the method comprising the steps of:

a) identifying the schedulers in an architecture;

b) identifying the schedulables constituting behavior;

c) assigning schedulables and schedulers to each other;

d) arranging for the schedulers to find their respective assigned schedulables;

e) arranging for the schedulables to find their respective assigned scheduler;

f) sending an event to a schedulable;

g) sending an activation notice from the schedulable in step f) to its assigned scheduler;

h) sending a message from the assigned scheduler of step g) to the schedulable of step f) to start its behavior's reaction; and i) sending a finish notice from the schedulable of step f) to the scheduler of step g) when said reaction is completed.

17. The method recited in claim 16 further comprising the steps of:

h1) having the scheduler of step g) determine whether the reaction of the schedulable of step f) must be preempted before it is finished;

h2) if in step h1) preemption is required, sending a suspend message from the scheduler of step g) to the schedulable of step f) to temporarily halt the execution of its reaction;

h3) if in step h1) preemption is required, causing the schedulable of step f) to halt its reaction in response to the suspend message;

h4) if in step H1) preemption is required, eventually sending a resume message from the scheduler of step g) to the schedulable of step f).

18. The method recited in claim 17 further comprising the steps of:

providing a next function which occurs when a scheduler receives an activation notice from an assigned schedulable while said scheduler is idle and when an assigned schedulable has finished a reaction;

said next function sending a handle to a schedulable which will be starting its behavior's reaction next.

19. The method recited in claim 17, further comprising the steps of:

providing a preempt function which occurs when an activation notice is received by a scheduler while its assigned schedulable is already reacting;

said preempt function determining whether a preemption should occur and whether such a preemption should be accomplished by suspending or aborting the reaction to be preempted.

20. The method recited in claim 17 further comprising the steps of:

providing a next function which occurs when a scheduler receives an activation notice from an assigned schedulable while said scheduler is idle and when an assigned schedulable has finished a reaction;

said next function sending a handle to a schedulable which will be starting its behavior's reaction next;

providing a preempt function which occurs when an activation notice is received by a scheduler while its assigned schedulable is already reacting;

said preempt function determining whether a preemption should occur and whether such a preemption should be accomplished by suspending or aborting the reaction to be preempted.

21. The method recited in claim 20 further comprising the steps of:

assigning transition times for completing selected states in said scheduler and schedulable operations, including the steps of starting and resuming reactions, finishing reactions, and suspending and aborting reactions.

22. The method recited in claim 17 wherein steps h1) to h4) are carried out in accordance with a cyclo-static scheduling policy.

23. The method recited in claim 17 wherein steps h1) to h4) are carried out in accordance with a cyclo-static scheduling policy.

24. The method recited in claim 17 wherein steps h1) to h4) are carried out in accordance with a preemptive static priority scheduling policy.

25. The method recited in claim 16 wherein steps h1) to h4) are carried out in accordance with a selected scheduling policy.

26. The method recited in claim 25 further comprising the step of altering said selected scheduling policy based upon behavior of said embedded systems.

27. The method recited in claim 25 further comprising the step of generating software code for a consumer device to implement said selected scheduling policy.

28. The method recited in claim 25 further comprising the step of implementing said scheduling policy by interfacing to existing commercially available software.

29. The method recited in claim 16 further comprising the step of:

scheduling behaviors of said schedulables based in part on the priorities of mapping assignments of said schedulables.

30. In a system-level design and integration system which facilitates composing behavior, capturing architecture and mapping behavior onto architecture, a method for specification of scheduling for simulation and implementation of consumer embedded systems; the method comprising the steps of:

a) identifying the schedulers in an architecture;

b) identifying the schedulables constituting behavior;

c) assigning schedulables and schedulers to each other;

d) arranging for the schedulers to find their respective assigned schedulables;

e) arranging for the schedulables to find their respective assigned scheduler;

f) sending an event to a schedulable;

g) sending an activation notice from the schedulable in step f) to its assigned scheduler;

h) sending a message from the assigned scheduler of step g) to the schedulable of step f) to start its behavior's reaction;

h1) having the scheduler of step g) determine whether the reaction of the schedulable of step f) must be preempted before it is finished;

h2) if in step h1) preemption is required, sending a suspend message from the scheduler of step g) to the schedulable of step f) to temporarily halt the execution of its reaction;

h3) if in step h1) preemption is required, causing the schedulable of step f) to halt its reaction in response to the suspend message;

h4) if in step h1) preemption is required, eventually sending a resume message from the scheduler of step g) to the schedulable of step f); and i) sending a finish notice from the schedulable of step f) to the scheduler of step g) when said reaction is completed.

31. The method according to claim 30, wherein each message comprises one in a series of schedulable-scheduler messages comprising, from a set of messages: (1) an activation message from the schedulable to a scheduler indicating the schedulable wants to react to an event; (2) a start message from the scheduler instructing the schedulable to start; (3) a suspend message sent form the scheduler to suspend the schedulable's reaction; (4) a resume message from the scheduler to the schedulable; and (5) a completion message from the schedulable to the scheduler.

32. The method according to claim 31, wherein each message of each scheduler is modeled based on a stored value of how long it takes to transition through states specified by the message.

33. The method according to claim 31, wherein the schedulables react to events, and the events comprise a set of events having a timestamp that indicates an order in which a simulator processes the events.

34. The method according to claim 33, wherein the order of processing comprises the smallest time stamped event first.

35. The method according to claim 30, wherein at least one of the schedulables is a hierarchy of lesser schedulables.

36. The method according to claim 30, wherein resources utilized to process the schedulables are architectural resources allocated to the schedulables via a contention process.

37. The method according to claim 30, wherein the schedulables are not assigned at a fixed frequency.

38. The method according to claim 30, wherein the schedulables are activated based on a combination of activation of the schedulable and a priority assigned to the schedulable.

39. The method according to claim 30, wherein at least one of the schedulers is configured to implement a scheduler interface.

40. The method according to claim 39, wherein the scheduler interface is part of a hierarchy of schedulers, such that the scheduler interface has a parent scheduler.

41. The method according to claim 30, wherein at least one of the schedulables is a scheduler comprising a hierarchy of schedulables, such that activation of the schedulable scheduler comprises an activation that propagates up the hierarchy of schedulables.

42. In a system-level design and integration system which facilitates composing behavior, capturing architecture and mapping behavior onto architecture, a method for specification of scheduling for simulation and implementation of consumer embedded systems; the method comprising the steps of:

a) identifying the schedulers in an architecture;

b) identifying the schedulables constituting behavior;

c) assigning schedulables and schedulers to each other;

d) arranging for the schedulers to find their respective assigned schedulables;

e) arranging for the schedulables to find their respective assigned scheduler;

f) sending an event to a schedulable;

g) sending an activation notice from the schedulable in step f) to its assigned scheduler;

h) sending a message from the assigned scheduler of step g) to the schedulable of step f) to start its behavior's reaction;

h1) having the scheduler of step g) determine whether the reaction of the schedulable of step f) must be preempted before it is finished;

h2) if in step h1) preemption is required, sending a suspend message from the scheduler of step g) to the schedulable of step f) to temporarily halt the execution of its reaction;

h3) if in step h1) preemption is required, causing the schedulable of step f) to halt its reaction in response to the suspend message;

h4) if in step H1) preemption is required, eventually sending a resume message from the scheduler of step g) to the schedulable of step f); and i) sending a finish notice from the schedulable of step f) to the scheduler of step g) when said reaction is completed;

wherein:

each message comprises one of a series of schedulable-scheduler messages comprising a set of messages comprising: (1) an activation message from the schedulable to a scheduler indicating the schedulable wants to react to an event; (2) a start message from the scheduler instructing the schedulable to start; (3) a suspend message sent form the scheduler to suspend the schedulable's reaction; (4) a resume message from the scheduler to the schedulable; and (5) a completion message from the schedulable to the scheduler;

the messages are modeled based on a stored value of how long it takes to transition through states specified by the message;

the schedulables react to events, and the events comprise a set of events having a timestamp that indicates an order in which a simulator processes the events;

the schedulables are activated based on a combination of non fixed frequency activation of the schedulable and a priority assigned to the schedulable;

resources utilized to process the schedulables are architectural resources allocated to the schedulables via a contention process;

at least one schedulable is a parent scheduler comprising a hierarchy of lesser schedulables including a scheduler configured to implement a scheduler interface; and activation of the parent schedulable comprises an activation that propagates up the hierarchy of schedulables.

* * * * *